(12) United States Patent
Seo et al.

(10) Patent No.: US 11,085,983 B2
(45) Date of Patent: Aug. 10, 2021

(54) MAGNETIC RESONANCE IMAGING APPARATUS AND METHOD OF GENERATING MAGNETIC RESONANCE IMAGE

(71) Applicants: SAMSUNG ELECTRONICS CO., LTD., Suwon-si (KR); KOREA ADVANCED INSTITUTE OF SCIENCE AND TECHNOLOGY, Daejeon (KR)

(72) Inventors: Hyun-seok Seo, Seoul (KR); Hyun-wook Park, Daejeon (KR); Joon-soo Kim, Seoul (KR); Seo-hee So, Daejeon (KR); Dae-ho Lee, Seongnam-si (KR)

(73) Assignees: SAMSUNG ELECTRONICS CO., LTD., Suwon-si (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 253 days.

(21) Appl. No.: 16/105,096

(22) Filed: Aug. 20, 2018

(65) Prior Publication Data
US 2019/0094324 A1 Mar. 28, 2019

(30) Foreign Application Priority Data
Sep. 27, 2017 (KR) ........................ 10-2017-0125405

(51) Int. Cl.
*G01R 33/56* (2006.01)
*G01R 33/561* (2006.01)
(Continued)

(52) U.S. Cl.
CPC ..... *G01R 33/5607* (2013.01); *G01R 33/5608* (2013.01); *G01R 33/5614* (2013.01);
(Continued)

(58) Field of Classification Search
None
See application file for complete search history.

(56) References Cited

U.S. PATENT DOCUMENTS 5,422,572 A 6/1995 Yao
5,704,357 A 1/1998 Miyazaki et al.
(Continued)

FOREIGN PATENT DOCUMENTS

JP 7-59753 A 3/1995
JP 7-323016 A 12/1995
(Continued)

OTHER PUBLICATIONS

"A Fast Multi-Contrast Knee Imaging Method Using a Hybrid bSSFP Pulse Sequence" to Seo et al. Apr. 7, 2017 (Year: 2017).*
(Continued)

*Primary Examiner* — Douglas X Rodriguez
(74) *Attorney, Agent, or Firm* — Sughrue Mion, PLLC

(57) ABSTRACT

The MRI apparatus includes a processor configured to apply a gradient echo pulse sequence that makes a sum of gradients applied during one repetition time (TR) in a slice selection direction, a phase encoding direction, and a frequency encoding direction equal zero and maintains spins in an object in a steady state; alternately apply, while the gradient echo pulse sequence is continuously applied, a first radio frequency (RF) pulse having a first flip angle and a second RF pulse having a second flip angle that is different from the first flip angle at each TR interval; and generate an MR image based on an echo signal acquired when the spins are in the steady state.

20 Claims, 10 Drawing Sheets

(51) Int. Cl.
*G01R 33/48* (2006.01)
*G01R 33/50* (2006.01)

(52) U.S. Cl.
CPC .......... *G01R 33/4816* (2013.01); *G01R 33/50* (2013.01); *G01R 33/5602* (2013.01)

(56) References Cited

U.S. PATENT DOCUMENTS

| | | |
|---|---|---|
| 6,307,368 B1 | 10/2001 | Vasanawala et al. |
| 6,483,307 B2 | 11/2002 | Ookawa |
| 9,594,145 B2 | 3/2017 | Lee et al. |
| 10,213,131 B2 | 2/2019 | Lee et al. |
| 2009/0273343 A1* | 11/2009 | Borthakur .............. A61B 5/055 324/307 |
| 2010/0280357 A1* | 11/2010 | Bi .......................... A61B 5/055 600/419 |
| 2011/0096974 A1 | 4/2011 | Gilson |
| 2017/0131377 A1 | 5/2017 | Kim et al. |
| 2017/0219672 A1* | 8/2017 | Miyazaki ........... G01R 33/4835 |
| 2017/0363699 A1* | 12/2017 | Ookawa ............. G01R 33/4831 |

FOREIGN PATENT DOCUMENTS

| | | |
|---|---|---|
| JP | 2009-50605 A | 3/2009 |
| JP | 2010-57990 A | 3/2010 |
| JP | 2012-254189 A | 12/2012 |
| JP | 2017-131664 A | 8/2017 |
| KR | 10-2014-0071850 A | 6/2014 |
| KR | 10-2016-0046624 A | 4/2016 |
| KR | 10-2017-0054977 A | 5/2017 |

OTHER PUBLICATIONS

Communication dated Feb. 21, 2019, issued by the European Patent Office in counterpart European Application No. 18196761.3.
Seo, H., et al., "A Fast Multi-Contrast Knee Imaging Method Using a Hybrid bSSFP Pulse Sequence", Apr. 7, 2017, Proceedings of the International Society for Magnetic Resonance in Medicine, 25th Annual Meeting and Exhibition, vol. 25, XP040691612, 3 pages total.
Communication dated Jun. 27, 2019 issued by the Korean Intellectual Property Office in counterpart Korean Application No. 10-2017-0125405.

* cited by examiner

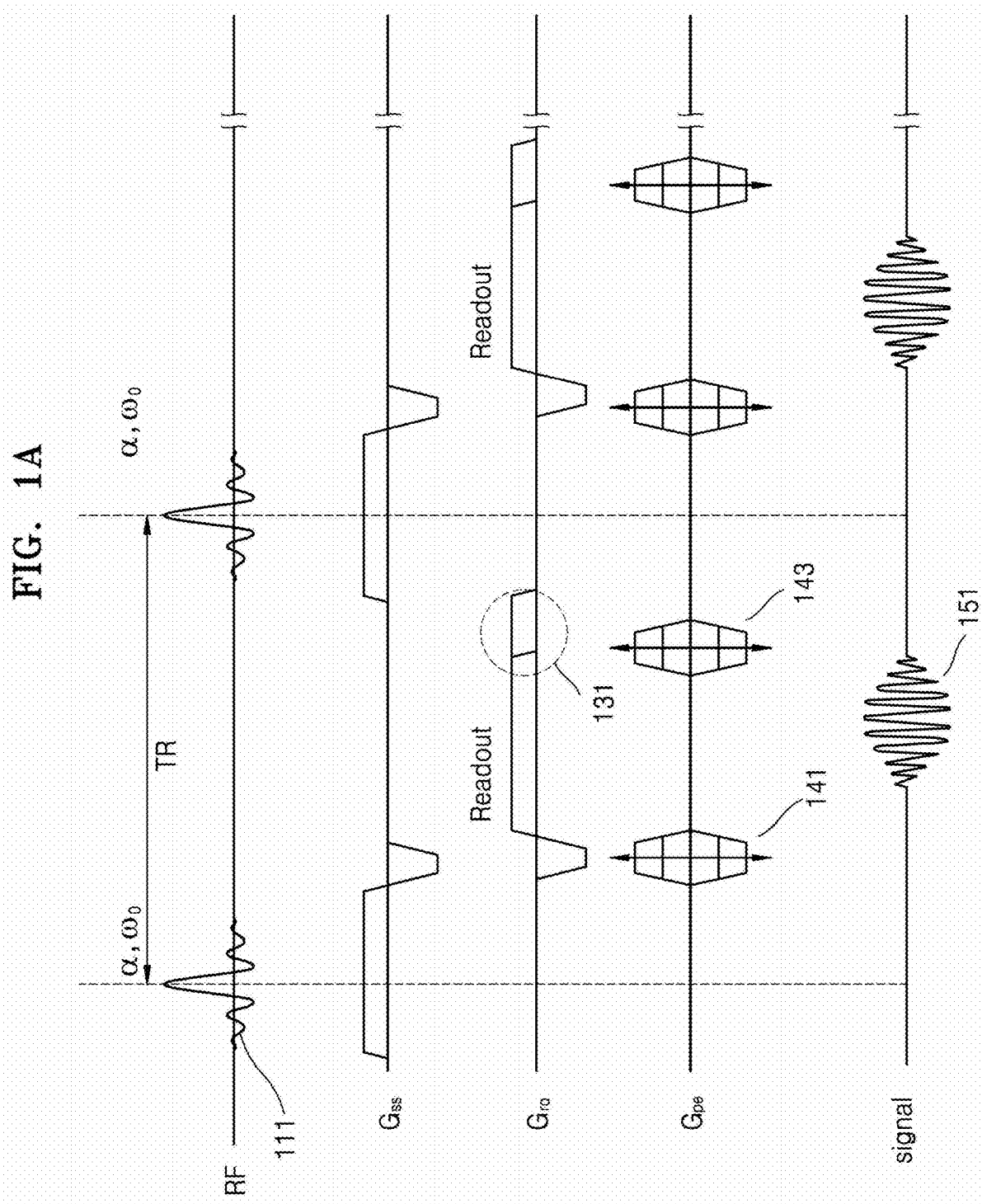

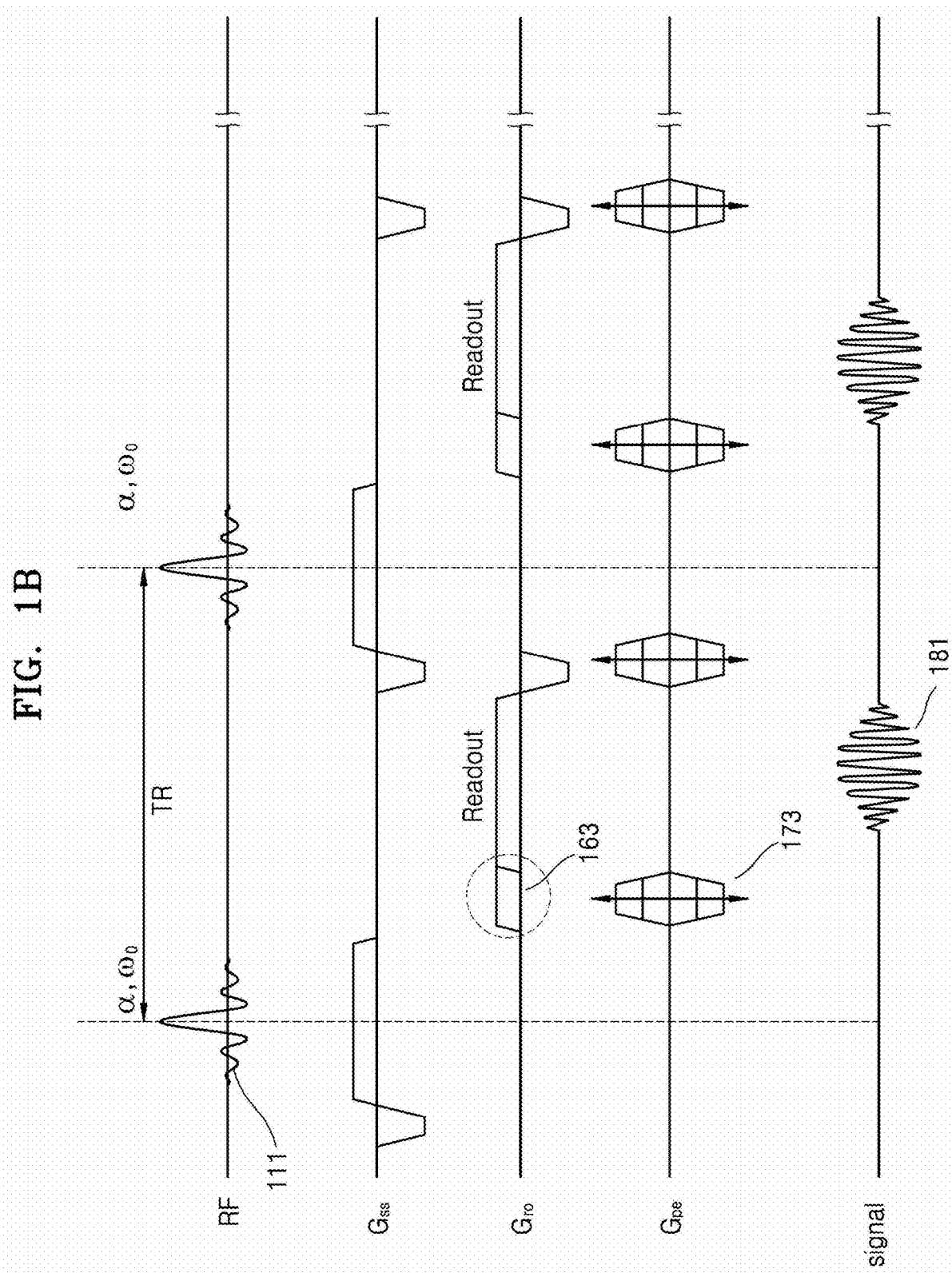

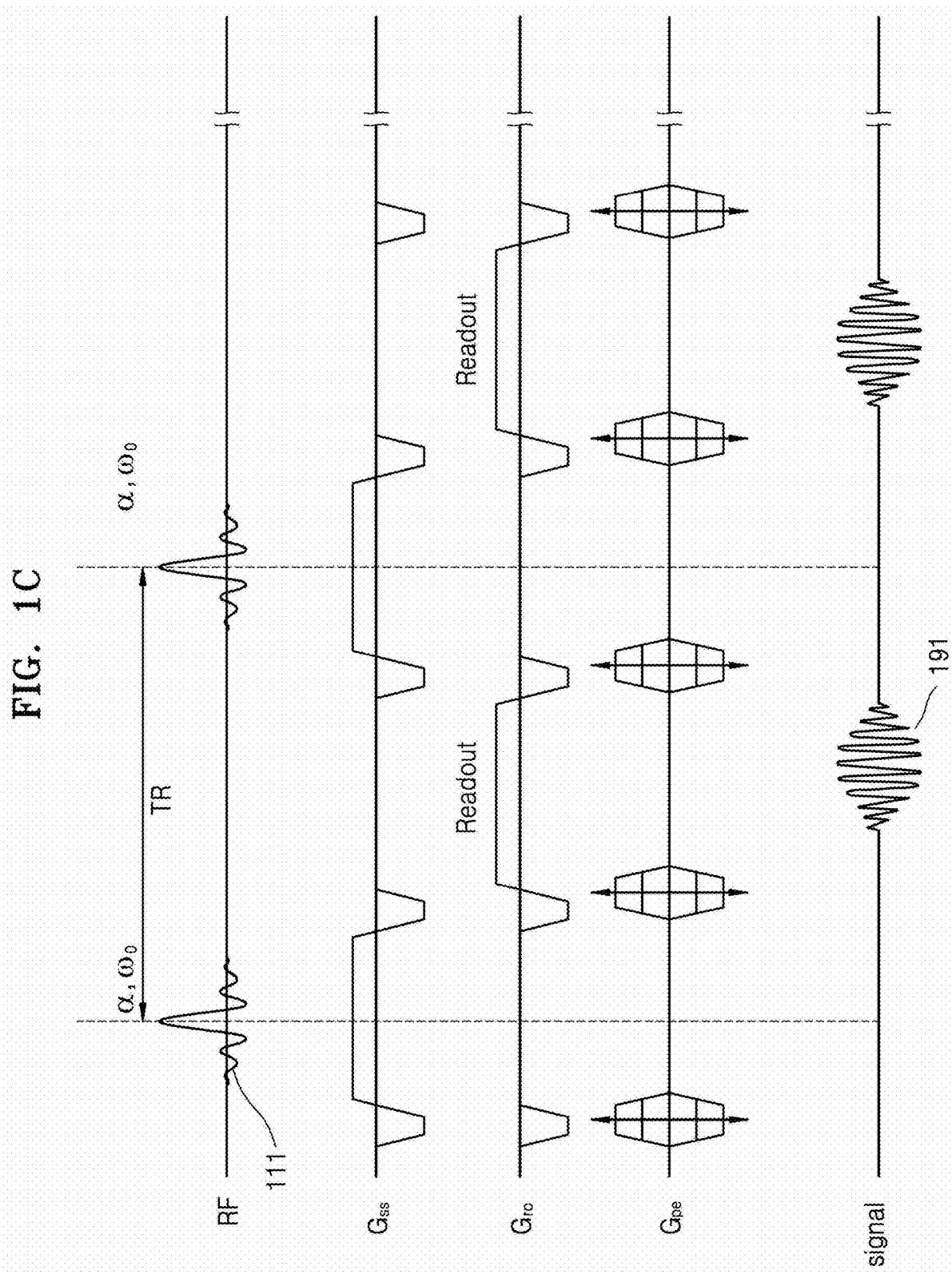

MAGNETIC RESONANCE IMAGING APPARATUS AND METHOD OF GENERATING MAGNETIC RESONANCE IMAGE

CROSS-REFERENCE TO RELATED APPLICATION(S)

This application is based on and claims priority under 35 U.S.C. § 119 to Korean Patent Application No. 10-2017-0125405, filed on Sep. 27, 2017, in the Korean Intellectual Property Office, the disclosure of which is incorporated by reference herein in its entirety.

BACKGROUND

1. Field

The disclosure relates to magnetic resonance imaging (MRI) apparatuses and methods of generating an MR image, and more particularly, to MRI apparatuses and methods for generating MR images having various contrasts.

2. Description of Related Art

An MRI apparatus uses a magnetic field to capture an image of a target object. MRI apparatuses have been widely used for accurate disease diagnosis because stereoscopic images of bones, lumbar discs, joints, nerves, ligaments, the heart, etc. can be obtained at desired angles.

The MR images may provide various types of information in the diagnosis of disease of the musculoskeletal (MSK) system due to their high soft tissue contrast. However, since fat contained in the MSK system blocks signals from cartilage and synovial fluid, fat suppression techniques may be additionally applied to existing sequences to prevent other signals from being intercepted by fat signals during MR imaging of the MSK system.

For example, when fat suppression techniques such as chemical shift spectral selective (CHESS), short inversion time inversion recovery (STIR), spectral adiabatic inversion recovery, spectral attenuated inversion recovery (SPAR), and Dixon (3-6) methods are used, a fat is suppressed, and the image of a MSK system may be obtained.

However, use of such fat suppression techniques requires a long scan time due to repetition of MRI scans. Further, since a fat suppression technique may remove not only fat signals but also information about bones, it has a limitation in achieving a desired contrast.

A balanced steady-state free precession (bSSFP) pulse sequence using a steady state of an MR signal is an MRI pulse sequence that allows fast acquisition of an image signal while offering a high signal-to-noise ratio (SNR). Thus, the bSSFP pulse sequence has been applied for imaging of an MSK system, a breast, and blood vessels of the brain.

However, imaging using a bSSFP pulse sequence requires a long scan time to obtain images having various contrasts. Such a long scan time may inconvenience a patient, and motion of the patient during a long scan may degrade image quality.

SUMMARY

Provided are methods and apparatuses whereby images having multiple contrasts, including longitudinal relaxation time (T1), transverse relaxation time (T2), and proton density (PD) images, may be obtained within a short time by applying a modified bSSFP pulse sequence, i.e., a hybrid bSSFP (HbSSFP), even without using fat suppression techniques.

Provided are methods and apparatuses whereby images having multiple contrasts may be obtained in a single sequence by using an HbSSFP pulse sequence, and accordingly the time required to obtain the images may be shortened compared to when separately obtaining images having respective contrasts by using a technique according to the related art.

Additional aspects will be set forth in part in the description which follows and, in part, will be apparent from the description, or may be learned by practice of the presented embodiments.

In accordance with an aspect of the disclosure, an MRI apparatus includes: a processor; and a memory connected to the processor, wherein the memory stores instructions, and the processor is configured to execute the instructions to: apply a gradient echo pulse sequence that makes a sum of gradients applied during one repetition time (TR) in each of a slice selection direction, a phase encoding direction, and a frequency encoding direction equal zero and maintains spins in an object in a steady state; alternately apply, when the gradient echo pulse sequence is continuously applied, a first radio frequency (RF) pulse having a first flip angle and a second RF pulse having a second flip angle that is different from the first flip angle at each TR interval; and generate an MR image based on an echo signal acquired when the spins are in the steady state.

The processor may be further configured to execute the instructions to: acquire a first MR signal in a first steady state that is reached after applying the first RF pulse; acquire a second MR signal in a second steady state that is reached after applying the second RF pulse; and obtain at least one of a sum image, which is a complex sum of first and second MR images respectively acquired based on the first and second MR signals, and a difference image which is a complex difference between the first and second MR images.

The processor may be further configured to execute the instructions to obtain a plurality of images having different contrasts, based on a weighted sum of the sum image and the difference image.

The processor may be further configured to execute the instructions to obtain at least one of a T1 image, a T2 image, and a PD image, based on the weighted sum of the sum image and the difference image.

The processor may be further configured to execute the instructions to obtain at least one image, in which a fat signal is suppressed, among a T1 image, a T2 image, and a PD image, based on the weighted sum of the sum image and the difference image.

The sum image may have a contrast similar to that of a PD image.

The object may include cartilage, and the difference image may include information about the cartilage.

The gradient echo pulse sequence may use an SSFP imaging technique.

The MRI apparatus may further include a display, wherein the processor is further configured to execute the instructions to: obtain a plurality of images having different contrasts; and display the obtained plurality of images.

The MRI apparatus may further include a scanner in which a static magnetic field and a gradient magnetic field are generated and which is configured to receive an MR signal emitted from the object.

In accordance with another aspect of the disclosure, a method of generating an MR image includes: applying a gradient echo pulse sequence that makes a sum of gradients applied during one TR in each of a slice selection direction, a phase encoding direction, and a frequency encoding direction equal zero and maintains spins in an object in a steady state; alternately applying, when the gradient echo pulse sequence is continuously applied, a first RF pulse having a first flip angle and a second RF pulse having a second flip angle that is different from the first flip angle at each TR interval; and generating an MR image based on an echo signal acquired when the spins are in the steady state.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 1A, 1B, and 1C are diagrams illustrating acquisition of MR images based on steady state free precession (SSFP) and bSSFP;

DETAILED DESCRIPTION

Figure 2:
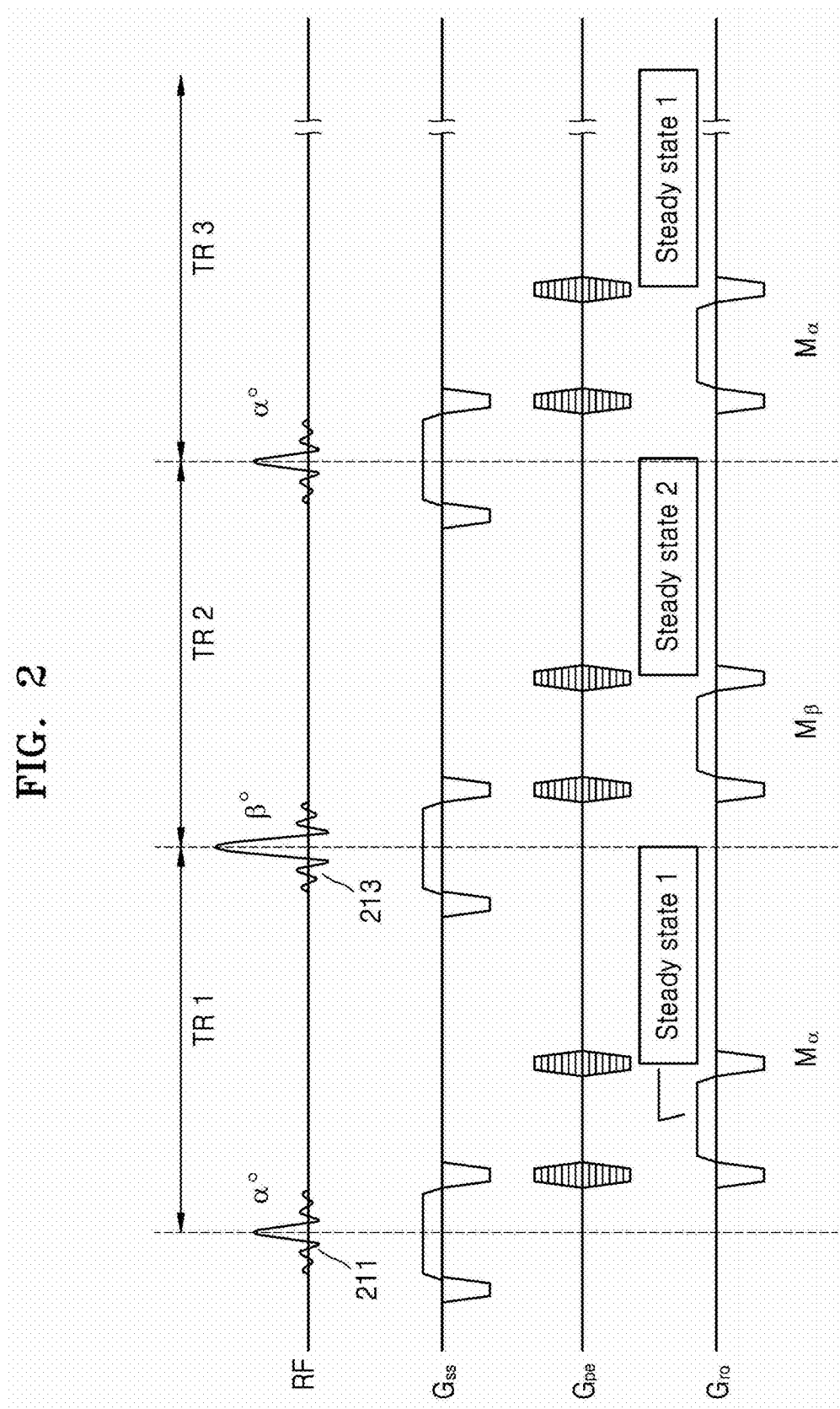
FIG. 2 is a pulse sequence diagram illustrating an HbSSFP method according to an embodiment.

The present specification describes principles of the present disclosure and sets forth embodiments thereof to clarify the scope of the present disclosure and to allow those of ordinary skill in the art to implement the embodiments. The present embodiments may have different forms.

Like reference numerals refer to like elements throughout. The present specification does not describe all components in the embodiments, and common knowledge in the art or the same descriptions of the embodiments will be omitted below. The term "part" or "portion" may be implemented using hardware or software, and according to embodiments, one "part" or "portion" may be formed as a single unit or element or include a plurality of units or elements. Hereinafter, the principles and embodiments of the present disclosure will be described in detail with reference to the accompanying drawings.

In the present specification, an "image" may include a medical image obtained by an MRI apparatus, a computed tomography (CT) apparatus, an ultrasound imaging apparatus, an X-ray apparatus, or another medical imaging apparatus.

Further, in the present specification, an "object" may be a target to be imaged and include a human, an animal, or a part of a human or animal. For example, the object may include a body part (an organ) or a phantom.

An MRI system acquires an MR signal and reconstructs the acquired MR signal into an image. The MR signal denotes an RF signal emitted from the object.

In the MRI system, a main magnet generates a static magnetic field to align a magnetic dipole moment of a specific atomic nucleus of the object placed in the static magnetic field along a direction of the static magnetic field. A gradient coil may generate a gradient magnetic field by applying a gradient signal to a static magnetic field and induce resonance frequencies differently according to each region of the object.

An RF coil may emit an RF signal to match a resonance frequency of a region of the object whose image is to be acquired. When gradient magnetic fields are applied, the RF coil may receive MR signals having different resonance frequencies emitted from a plurality of regions of the object. Through this process, the MRI system may obtain an image from an MR signal by using an image reconstruction technique.

FIGS. 1A through 1C are diagrams for explaining acquisition of MR images based on an SSFP pulse sequence and a bSSFP pulse sequence.

An SSFP pulse sequence is a type of a gradient echo (GRE) pulse sequence, and a signal may be acquired when a transverse magnetization signal (or MR signal) from spins, which is generated based on an RF pulse, is maintained in a steady state at each TR interval by making the sum of gradients applied within one TR equal zero. According to the SSFP pulse sequence, RF pulses are repeatedly transmitted during TR that is substantially shorter than T1 or T2 of spins in an object.

Referring to FIGS. 1A and 1B, the sum of phase encoding gradients applied during one TR is made to equal zero in such a manner that spins may be maintained in a steady state. An SSFP sequence may be classified into SSFP-free induction decay (FID) and SSFP-Echo.

FIG. 1A is a pulse sequence diagram illustrating an SSFP-FID method.

In FIG. 1A, RF denotes an RF pulse 111 applied to an object. RF pulses applied to the object at each TR all have the same flip angle α.

$G_{ss}$, $G_{ro}$, and $G_{pe}$ may respectively represent a slice selection gradient, a readout gradient, and a phase encoding gradient applied over time. A readout gradient $G_{ro}$ may correspond to a frequency encoding gradient.

An extra gradient 131 may be applied in a readout direction, and a rewinder gradient 143 having the same magnitude as but an opposite phase to a phase encoding gradient 141 may be applied in a phase encoding direction. The rewinder gradient 143 is used to maintain a steady state of spins by making the total sum of phase encoding gradients applied within one TR equal zero.

An echo signal 151 due to a FID signal from spins, which is generated by an RF pulse, peaks at a time point when the sum of gradients applied in the readout direction during one TR is zero, and a signal acquired at the time point may be used to reconstruct an image. In general, to acquire k-space data, frequency information of spins is encoded using such echo signals. An SSFP-FID method is also known as Fast Imaging with Steady-state Precession (FISP), Gradient Recall Acquisition Using Steady States (GRASS), Turbo Field Echo (TFE), etc.

FIG. 1B is a pulse sequence diagram illustrating an SSFP-Echo method.

According to the SSFP-Echo method, an image may be obtained using an echo signal 181 from spins, which is generated not by an RF pulse applied immediately before acquisition of the echo signal 181 but by its preceding RF pulse. An RF pulse, a slice selection gradient $G_{ss}$, a readout gradient $G_{ro}$, and a phase encoding gradient $G_{pe}$ shown in FIG. 1B are similar to their counterparts described with reference to FIG. 1A. However, the order in which an extra gradient 163 and a rewinder gradient 173 are respectively applied in a readout direction and a phase encoding direction is different from the order in which the extra gradient 131 and the phase encoding gradient 141 of FIG. 1A are applied.

Referring to FIG. 1B, the echo signal 181 from spins peaks at a time point when the sum of gradients applied in the readout direction during one TR is zero.

An SSFP-Echo method is also called reversed FISP (PISF), SSFP, T2-weighted Fast Field Echo (T2-FFE), etc.

FIG. 1C is a pulse sequence diagram illustrating a bSSFP method.

The bSSFP method is used to acquire a signal 191 in which an echo signal generated according to SSFP-FID is added to an echo signal generated under SSFP-Echo at a time and to measure both echo signals at the same time point. Similarly to the SSFP, in a bSSFP pulse sequence, RF pulses are repeatedly transmitted during TR that is generally substantially shorter than T1 or T2 time of spins in an object.

According to the bSSFP pulse sequence, spins may be maintained in a steady state by making a vector sum of all gradients applied during one TR equal zero. In detail, referring to FIG. 1C, the sum of each of a slice selection gradient $G_{ss}$, a readout gradient $G_{ro}$, and a phase encoding gradient $G_{pe}$ applied within one TR is zero.

By using both echo signals respectively generated according to SSFP-FID and SSFP-Echo, the bSSFP pulse sequence may provide an image having a high SNR.

A bSSFP method is also called True FISP, Fast imaging Employing Steady-state Acquisition (FIESTA), balanced FFE, etc.

Although FIG. 1C shows acquisition of echo signals respectively generated according to SSFP-FID and SSFP-Echo at the same time point, echo signals respectively generated according to SSFP-FID and SSFP-Echo may be acquired at different time points within one TR. A method whereby signals respectively acquired according to SSFP-FID and SSFP-Echo at different time points are combined together and used for image acquisition is called Fast Acquisition Double Echo (FADE) or Double Echo Steady State (DESS).

FIG. 2 is a pulse sequence diagram illustrating an HbSSFP method according to an embodiment.

An HbSSFP sequence may be applied to obtain MR images having multiple contrasts with respect to an object. The object may include an MSK system such as shoulder and knee joints.

According to an HbSSFP pulse sequence shown in FIG. 2, similarly to SSFP, RF pulses are repeatedly transmitted during TR that is substantially shorter than T1 or T2 time of spins in the object. A steady state of spins may be maintained by making a vector sum of all gradients applied during each TR equal zero. In other words, in the HbSSFP pulse sequence, the sum of each of a slice selection gradient $G_{ss}$, a readout gradient $G_{ro}$, and a phase encoding gradient $G_{pe}$ applied within one TR is zero.

Referring to FIG. 2, a first RF pulse 211 having a first flip angle and a second RF pulse 213 having a second flip angle different from the first flip angle may be alternately applied at each TR interval. FIG. 2 shows that the first and second flip angles are α and β, respectively.

In general, TR is the length of time from application of an RF pulse to application of the next RF pulse. For example, a first TR1 may be the length of time from application of the first RF pulse 211 to application of the second RF pulse 213.

For convenience, it is assumed hereinafter that an RF pulse is applied within TR.

For example, when time points when the first and second RF pulses 211 and 213 are applied are respectively included in the first TR1 and the second TR2, an RF pulse having the first flip angle corresponding to the first RF pulse 211 may be applied during a third TR3 subsequent to the second TR2. An RF pulse having the second flip angle corresponding to the second RF pulse 213 may be applied within TR subsequent to the third TR3.

According to the HbSSFP pulse sequence, information about desired multiple contrasts may be acquired by alternately changing a flip angle of an RF pulse being applied at each TR interval.

It is also possible to change both a direction and a magnitude of a flip angle of an RF pulse being applied.

An MR signal acquired using a bSSFP sequence may be expressed by using Equation (1) below:

$$M=(I-R_\alpha Q)^{-1}(1-E_1)R_\alpha M_0, \quad (1)$$

where M is a magnetization vector for spins after application of an RF pulse, $M_0$ is an initial magnetization vector for spins, $R_\alpha$ is a rotation matrix corresponding to an RF pulse having a flip angle α, Q is a matrix involving a precessional motion and a T2 relaxation time, and $E_1$ is $\exp(-t/T1)$.

By using the bSSFP sequence, components of a magnetization vector for spins, which vary according to a flip angle of an RF pulse, may be obtained and accordingly, information about multiple contrasts may be acquired.

For example, when a flip angle of an RF pulse is set to a large value, information about an image signal having a contrast close to that of a T2 image may be acquired. On the other hand, when the flip angle of the RF pulse is set to a small value, information about image signals having multiple contrasts such as T1, T2, and PD contrasts may be obtained. By adjusting a flip angle of an RF pulse, it is possible to adjust intensities of an SSFP-FID component and an SSFP-Echo component included in an echo signal.

$$M_\alpha=(I-R_\alpha Q R_\beta)^{-1}R_\alpha(QR_\beta+I)(1-E_1)M_0 \quad (2)$$

where $M_\alpha$ is a magnetization vector after application of an RF pulse having a flip angle α.

After the application of the RF pulse having a flip angle α, spins are in a first steady state (Steady state 1).

$$M_\beta=(I-R_\beta Q R_\alpha Q)^{-1}R_\beta(QR_\alpha+I)(1-E_1)M_0 \quad (3)$$

where $M_\beta$ is a magnetization vector after application of an RF pulse having a flip angle β, and $R_\beta$ is a rotation matrix corresponding to the RF pulse having a flip angle β.

After the application of an RF pulse having a flip angle β, spins are in a second steady state (Steady state 2).

Magnetization vector $M_\alpha$ may correspond to a first MR signal, and magnetization vector $M_\beta$ may correspond to a second MR signal.

According to the HbSSFP pulse sequence shown in FIG. 2, images having multiple contrasts may be obtained by combining together first and second MR images respectively obtained based on first and second MR signals acquired after application of different RF pulses.

For example, when flip angles of RF pulses are small, it is possible to acquire information in which cartilage is emphasized from a difference image between the first and second MR images, and anatomical information with a contrast similar to that obtained in a bSSFP sequence according to the related art from a sum image of the first and second MR images.

The first and second MR images may be images on the complex plane. The sum image may be an image obtained based on a complex sum of the first and second MR images respectively generated based on the first and second MR signals. The difference image may be an image obtained based on a complex difference between the first and second MR images.

Further, it is possible to obtain an MR image having multiple contrasts with respect to cartilage and bone by using a weighted sum of the difference image between and the sum image of the first and second MR images.

Figure 3:
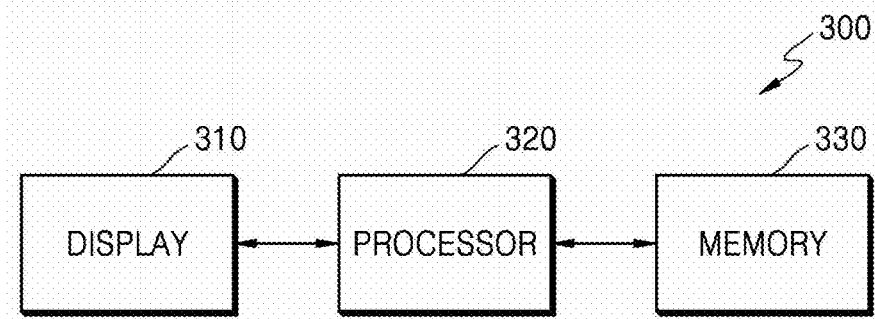
FIG. 3 is a block diagram of an MRI apparatus according to an embodiment.

FIG. 3 is a block diagram of an MRI apparatus 300 according to an embodiment.

The MRI apparatus 300 may be an apparatus for obtaining an MR image of an object based on an HbSSFP pulse sequence.

Referring to FIG. 3, the MRI apparatus 300 includes a display 310, a processor 320, and a memory 330.

The MRI apparatus 300 may be an MRI apparatus including a scanner in which a static magnetic field and a gradient magnetic field are generated, and the scanner receives an MR signal emitted from an object. The MRI apparatus 300 may be connected to another MRI apparatus to control the other MRI apparatus. The MRI apparatus 300 may be included in a console for controlling the other MRI apparatus.

The display 310 may be included in the MRI apparatus 300 and/or may be attached to the MRI apparatus 300.

According to an embodiment, the processor 320 may execute instructions stored in the memory 330.

The processor 320 may be configured to obtain an MR image based on MR signal data stored in the memory 330 or received from an external device. For example, the MR signal data may include an MR signal received from a scanner.

According to an embodiment, the memory 330 may store one or more instructions that are executed by the processor 320.

For example, the memory 330 may store various pieces of data, programs, or applications for driving and controlling the MRI apparatus 300. Each program stored in the memory 330 may include one or more instructions. The programs or applications stored in the memory 330 may be executed by the processor 320.

According to an embodiment, the processor 320 may control the MRI apparatus 300 to apply a GRE pulse sequence which makes a total sum of gradients applied during one TR in each of a slice selection direction, a phase encoding direction, and a frequency encoding direction equal zero and maintains spins in the object in a steady state.

The processor 320 may control the MRI apparatus 300 to alternately apply a first RF pulse having a first flip angle and a second RF pulse having a second flip angle at each TR interval when a GRE pulse sequence is continuously applied and generate an MR image based on echo signals acquired when spins are in a steady state.

The processor 320 may control the MRI apparatus 300 to acquire a first MR signal when spins are in a first steady state that is reached after application of the first RF pulse and a second MR signal when spins are in a second steady state that is reached after application of the second RF pulse.

The processor 320 may control the MRI apparatus 300 to obtain at least one of a sum image that is a complex sum of first and second MR images respectively obtained based on first and second MR signals and a difference image that is a complex difference between the first and second MR images.

The processor 320 may control the MRI apparatus 300 to obtain a plurality of images having different contrasts based on a weighted sum of the sum image and the difference image. The sum image and the difference image may be images on the complex plane or images having only complex-valued size information.

The processor 320 may control the MRI apparatus 300 to obtain at least one of a T1 image, a T2 image, and a PD image based on a weighted sum of the sum image and the difference image.

The processor 320 may control the MRI apparatus 300 to obtain at least one image in which a fat signal is suppressed based on a T1 image, a T2 image, and a PD image by using a weighted sum of the sum image and the difference image.

According to an embodiment, the sum image may be an image having a contrast similar to that of a PD image.

According to an embodiment, the object may include cartilage, and the difference image may be an image including information about the cartilage.

The processor 320 may control the MRI apparatus 300 to display the obtained plurality of images having different contrasts on the display 310.

Figure 4:
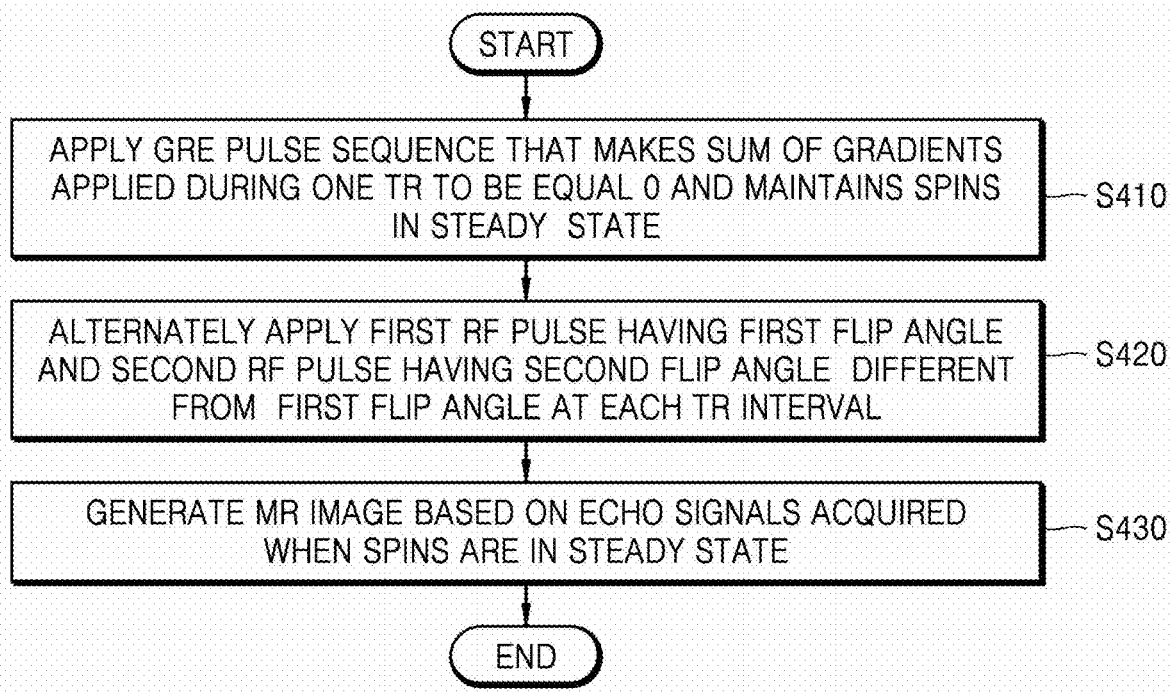
FIG. 4 is a flowchart of a method, performed by an MRI apparatus, of generating an MR image, according to an embodiment.

FIG. 4 is a flowchart of a method, performed by the MRI apparatus 300 (refer to FIG. 3), of generating an MR image.

The MRI apparatus 300 may apply, during one TR, a GRE pulse sequence which makes a total sum of gradients applied during one TR in each of a slice selection direction, a phase encoding direction, and a frequency encoding direction equal zero and maintains spins in the object in a steady state (operation S410).

For example, in operation S410, the MRI apparatus 300 may apply an HbSSFP pulse sequence.

The MRI apparatus 300 may alternately apply, when the GRE pulse sequence is continuously applied, a first RF pulse having a first flip angle and a second RF pulse having a second flip angle that is different from the first flip angle at each TR interval (operation S420).

The MRI apparatus 300 may generate an MR image based on echo signals acquired when spins are in a steady state (operation S430).

The MRI apparatus 300 may obtain images having multiple contrasts by combining together first and second MR images respectively obtained based on first and second MR signals acquired after application of different RF pulses.

Figure 5:
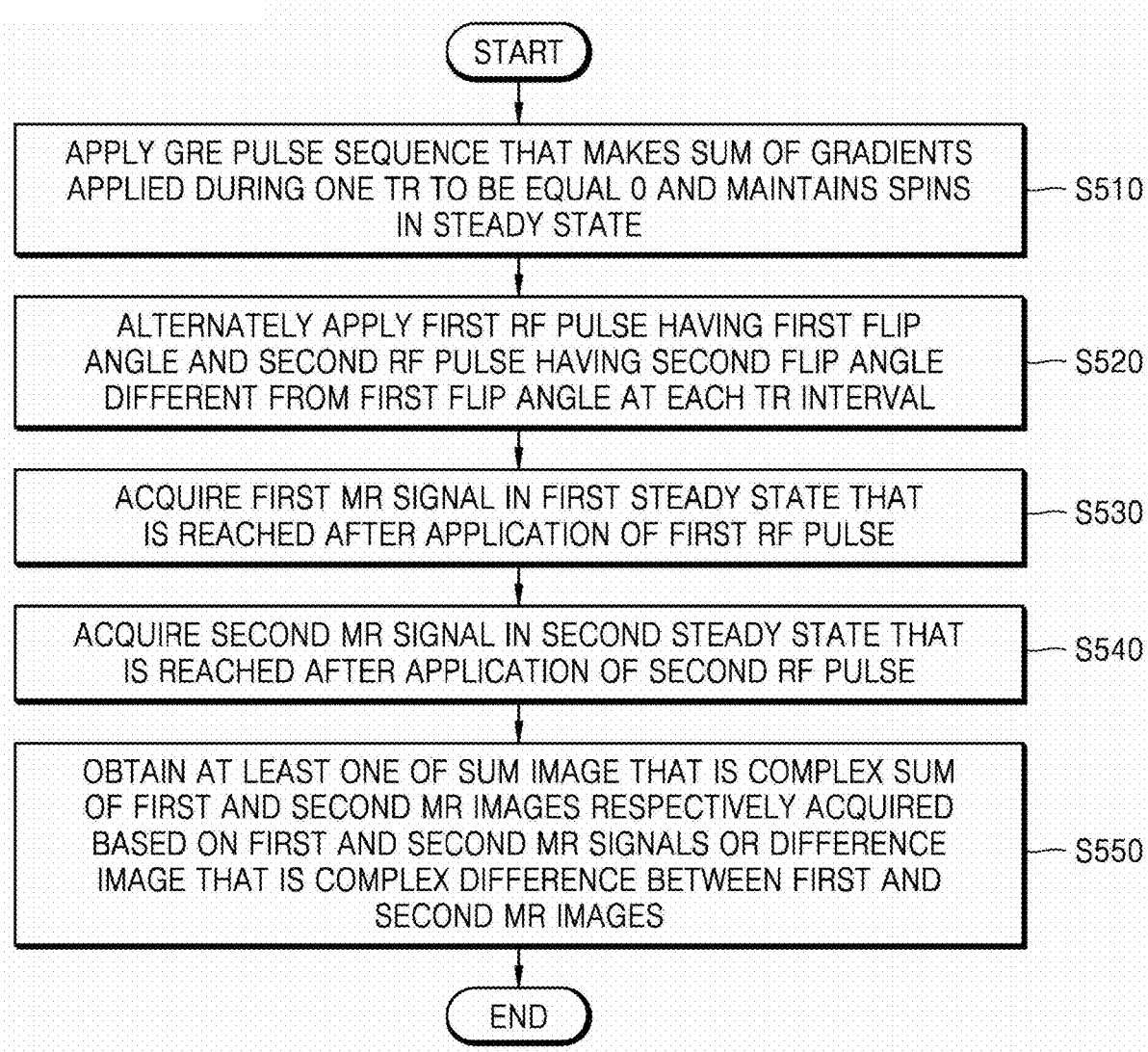
FIG. 5 is a flowchart of a method, performed by an MRI apparatus, of generating an MR image, according to an embodiment.

FIG. 5 is a flowchart of a method, performed by the MRI apparatus 300, of generating an MR image, according to an embodiment.

Since operations S510 and S520 of FIG. 5 respectively correspond to operations S410 and S420 described with reference to FIG. 4, a detailed description thereof will be omitted.

According to an embodiment, the MRI apparatus 300 may obtain an MR signal in a steady state by using an HbSSFP sequence.

The MRI apparatus 300 may acquire a first MR signal in a first steady state that is reached after application of a first RF pulse (operation S530).

The MRI apparatus 300 may acquire a second MR signal in a second steady state that is reached after application of a second RF pulse (operation S540).

According to an embodiment, spins reach a first steady state after application of an RF pulse having a first flip angle, and a second steady state after application of an RF pulse having a second flip angle. Thus, the MRI apparatus 300 may obtain a first MR image in the first steady state after applying the first RF pulse that is the RF pulse having the first flip angle. The MRI apparatus 300 may obtain a second MR image in the second steady state after applying the second RF pulse that is the RF pulse having the second flip angle.

The MRI apparatus 300 may obtain at least one of a sum image that is a complex sum of first and second MR images respectively acquired based on the first and second MR signals and a difference image that is a complex difference between the first and second MR images (operation S550).

The MRI apparatus 300 may obtain images having multiple contrasts by combining the sum image with the difference image. A combination of the sum image and the difference image may be a weighted sum of sizes of the sum image and the difference image.

Figure 6:
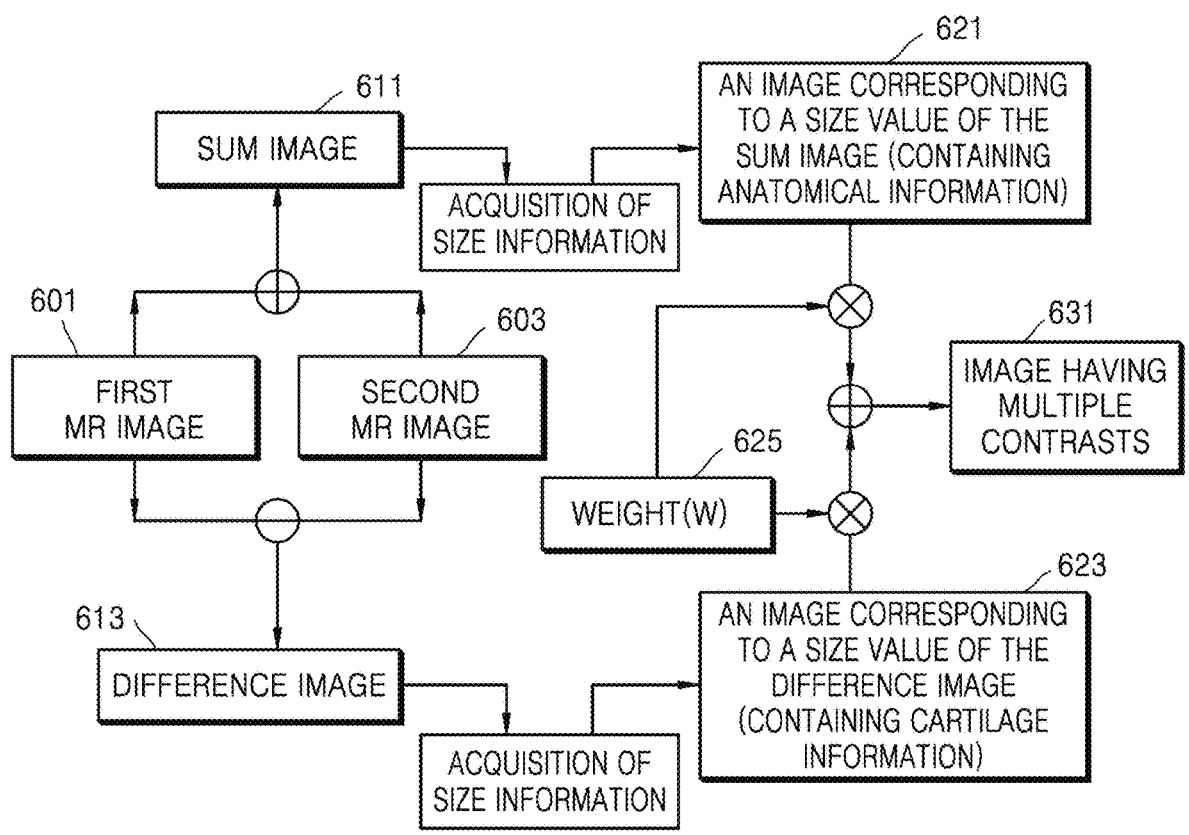
FIG. 6 is a block diagram illustrating a method of obtaining images having multiple contrasts by combining a sum image with a difference image, according to an embodiment.

FIG. 6 is a block diagram illustrating a method of obtaining images having multiple contrasts by combining a sum image with a difference image, according to an embodiment.

The MRI apparatus 300 may acquire an MR signal in a steady state by using an HbSSFP sequence. The MRI apparatus 300 may obtain a sum image 611 and a difference image 613. The sum image 611 is a complex sum of a first MR image 601 that is an image on a complex plane acquired from magnetization vector $M_\alpha$ and a second MR image 603 that is an image on the complex plane acquired from magnetization vector $M_\beta$. The difference image 613 is a complex difference between the first and second MR images 601 and 603.

The magnetization vectors $M_\alpha$ and $M_\beta$ may respectively correspond to the first and second MR signals acquired at different flip angles as described above.

For example, when a flip angle of an RF pulse being applied is alternately changed at each TR interval according to the HbSSFP pulse sequence, the magnetization vector $M_\alpha$ may be acquired in a first steady state after a first RF pulse having a first flip angle is applied, and the magnetization vector $M_\beta$ may be acquired in a second steady state after a second RF pulse having a second flip angle that is different from the first flip angle is applied.

The MRI apparatus 300 may obtain an image 621 corresponding to a size value of the sum image 611 having size information and phase information. The image 621 may contain anatomical information.

The MRI apparatus 300 may obtain an image 623 corresponding to a size value of the difference image 613 having size information and phase information. The image 623 may contain information about cartilage.

The MRI apparatus 300 may obtain one or more images 631 having multiple contrasts by applying a weight 625 to the images 621 and 623 and adding the resulting values. The weight applied to the image 621 and the image 623 may be the same or different.

For example, when the first and second flip angles $\alpha$ and $\beta$ of the first and second RF pulses both have small values, it is possible to acquire information in which cartilage is emphasized from the difference image 613 between the first and second MR images 601 and 603, and anatomical information with a contrast similar to that obtained in a bSSFP sequence according to the related art from the sum image 611 of the first and second MR images 601 and 603. For example, the first and second flip angles $\alpha$ and $\beta$ may both be set to be less than 45°.

According to an embodiment, when a difference between the first and second flip angles $\alpha$ and $\beta$ of the first and second RF pulses is large, a contrast of an obtained MR image may be greatly affected by the first and second RF pulses respectively having the first and second flip angles. When a difference between the first and second flip angles $\alpha$ and $\beta$ is made small, MR signals containing information corresponding to multiple contrasts may be acquired by combining magnetization vectors $M_\alpha$ and $M_\beta$.

According to an embodiment, when the first and second flip angles $\alpha$ and $\beta$ both have small values and a difference therebetween is small, images having more various contrasts may be obtained by adjusting weights w for the images 621 and 623.

Figure 7:
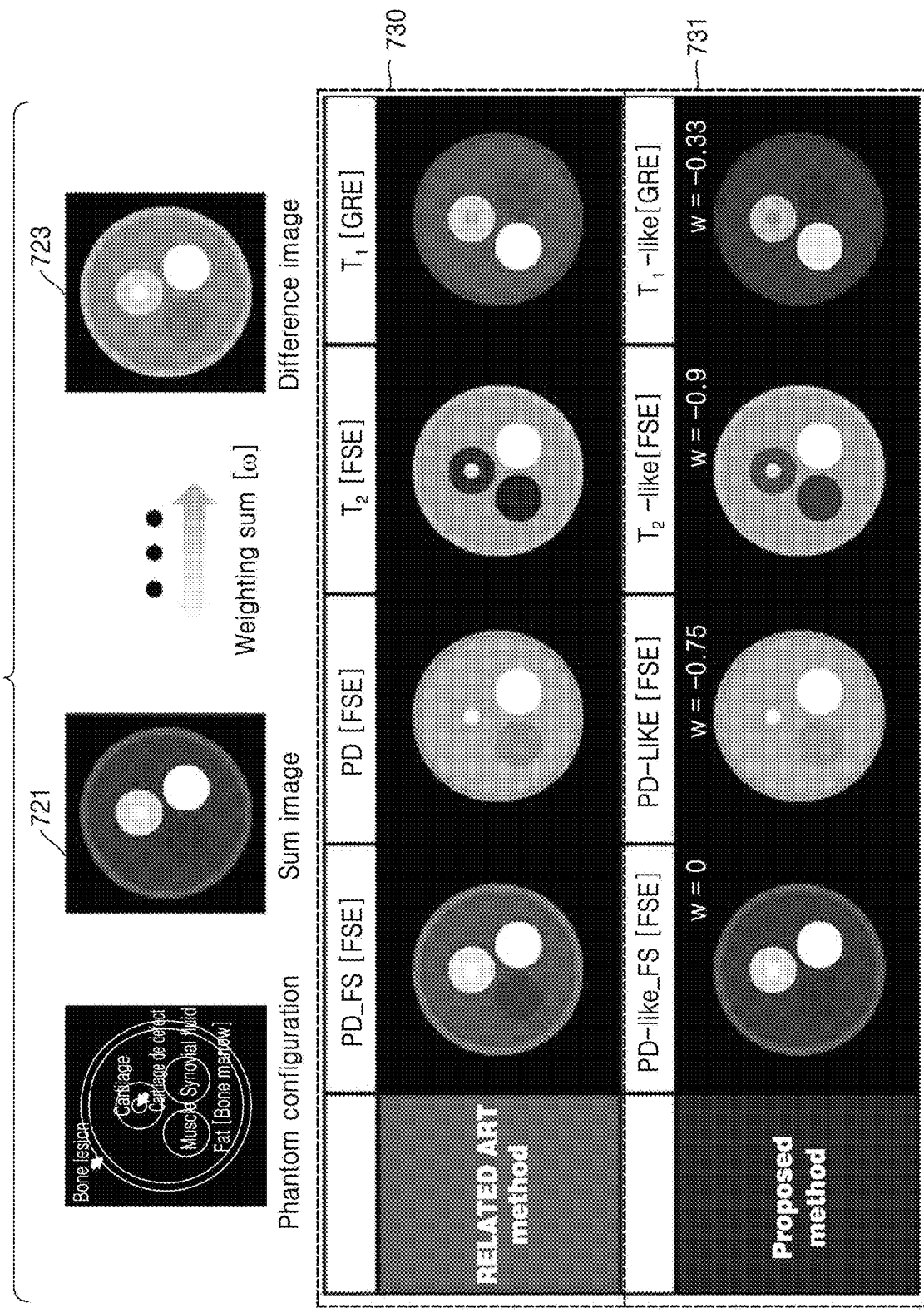
FIG. 7 illustrates a comparison between images having multiple contrasts obtained according to an embodiment and images obtained using a method according to the related art.

FIG. 7 illustrates comparison between images having multiple contrasts obtained according to an embodiment and images obtained using a method according to the related art.

Referring to FIG. 7, the MRI apparatus 300 may obtain the images 731 having four contrasts in a single sequence by using the HbSSFP pulse sequence according to an embodiment.

However, in methods according to the related art, images 730 having a plurality of contrasts have to be separately obtained using different sequences.

The related art MRI apparatus may obtain images 730 of the object having multiple contrasts based on methods according to the related art, such as a fast spin echo (FSE) sequence and a GRE sequence. The images 730 having multiple contrasts include a fat-suppressed PD image PD_FS, a PD image, a T2 image, and a T1 image. For example, the fat-suppressed PD image PD_FS obtained using a method according to the related art may be an image obtained by applying a chemical shift spectral selective (CHESS) method.

When the images 731 having four contrasts are obtained based on the HbSSFP sequence according to an embodiment, the time required to obtain the images 731 may be shortened compared to when the images 730 having four contrasts are obtained using the methods according to the related art.

FIG. 7 shows an example of the images 731 having four contrasts obtained by the MRI apparatus 300. The MRI apparatus 300 may obtain images having different contrasts other than the PD-like_FS image, the PD-like image, the T1-like image, and T1-like image. For example, the MRI apparatus 300 may further obtain a fat-suppressed T1 image, a fat-suppressed T2 image, etc. by adjusting a weight.

For example, the TR and time echo (TE) may be set to 5.0 ms and 2.5 ms, respectively, the first and second flip angles may be set to 7° and 10°, respectively, and a matrix size for acquisition of k-space data may be set to 256×256.

The object may be a phantom similar to components of bone lesion, cartilage, cartilage defect, muscle, fat, bone marrow, synovial fluid, and the like.

The MRI apparatus 300 may obtain a sum image 721 and a difference image 723. For example, the sum image 721 and the difference image 723 may respectively correspond to the images 621 and 623 described with reference to FIG. 6.

In detail, the sum image 721 may be obtained based on a complex sum of the first MR image 601 (refer to FIG. 6) that is an image on the complex plane acquired from magnetization vector $M_\alpha$ and the second MR image 603 (refer to FIG. 6) that is an image on the complex plane acquired from magnetization vector $M_\beta$. For example, the sum image 721 may be an image containing only size information of a complex sum of the first and second MR images 601 and 603. The magnetization vectors $M_\alpha$ and $M_\beta$ may respectively correspond to the first and second MR signals described with reference to FIG. 2.

The difference image 723 may be an image obtained based on a complex difference between the first and second MR images 601 and 603. For example, the difference image 723 may be an image containing only size information of a complex difference between the first and second MR images 601 and 603.

The MRI apparatus 300 may obtain images 731 having multiple contrasts by applying a weight w to the sum image 721 and the difference image 723 and adding the resulting values.

For example, when a weight w is set to 0, the MRI apparatus 300 may obtain a PD-like_FS image that is similar to a fat-suppressed PD image. An image obtained by assigning a weight w of 0 is the same as a sum image. Furthermore, when the weight w is set to −0.75, the MRI apparatus 300 may obtain a PD-like image similar to a PD image. When the weight w is set to −0.9, the MRI apparatus 300 may obtain a T2-like image similar to a T2 image. When the weight w is set to −0.33, the MRI apparatus 300 may obtain a T1-like image similar to a T1 image.

According to an embodiment, a fat-suppressed PD image PD_FS may be obtained by acquiring the sum image 721 in which a weight is set to 0 instead of separately applying a fat suppression technique. Thus, it is possible to shorten the image acquisition time compared to when using a method according to the related art.

Figure 8:
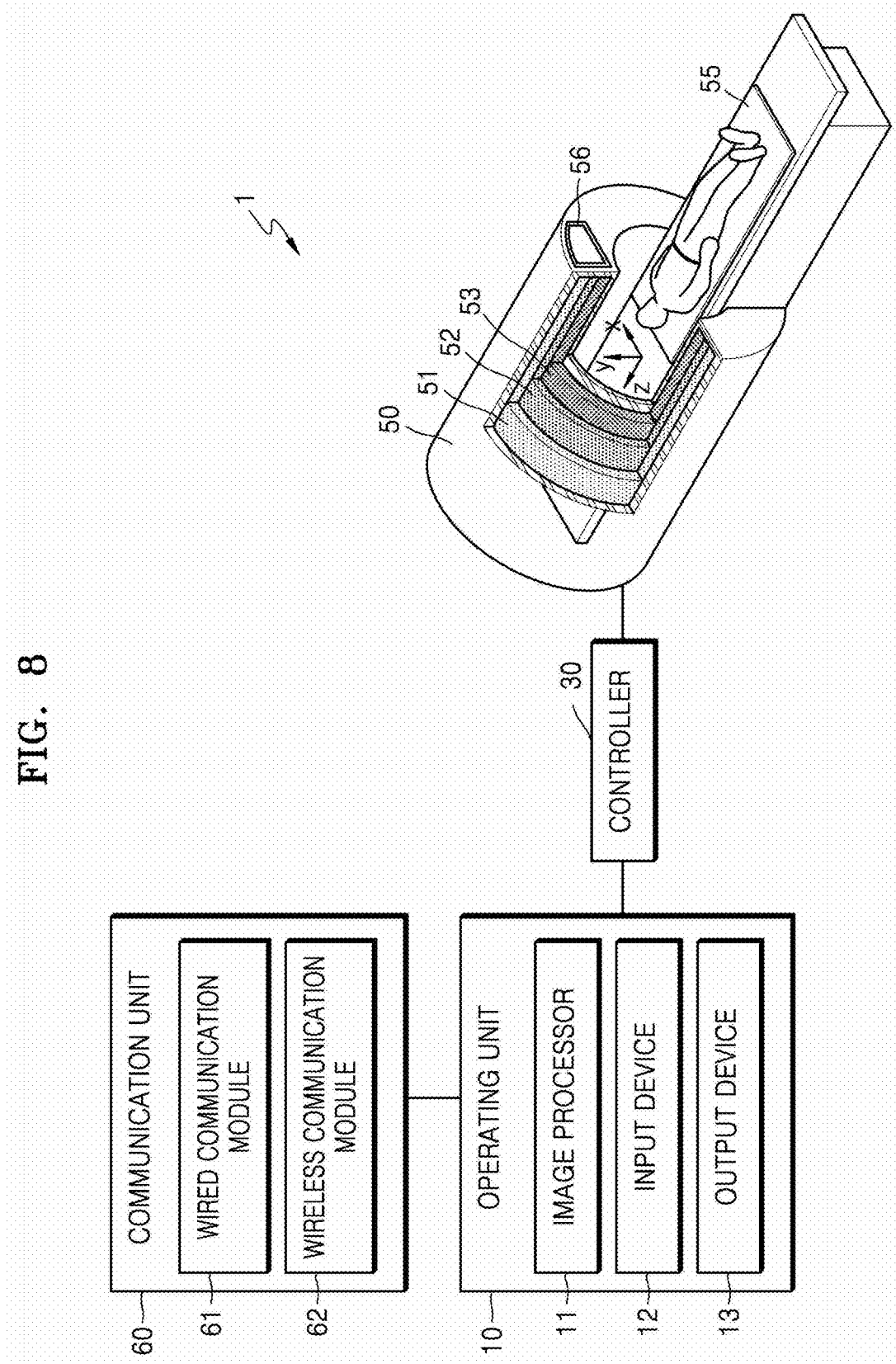
FIG. 8 is a schematic diagram of an MRI system.

FIG. 8 is a schematic diagram of an MRI system 1 which may correspond to the MRI apparatus 300 or may include the MRI apparatus 300.

Referring to FIG. 8, the MRI system 1 may include an operating unit 10, a controller 30, and a scanner 50. The controller 30 may be independently separated from the operating unit 10 and the scanner 50. The controller 30 may be separated into a plurality of sub-components and incorporated into the operating unit 10 and the scanner 50 in the MRI system 1.

The scanner 50 may be formed to have a cylindrical shape (e.g., a shape of a bore) having an empty inner space into which an object may be inserted. A static magnetic field and a gradient magnetic field are generated in the inner space of the scanner 50, and an RF signal is emitted toward the inner space.

The scanner 50 may include a static magnetic field generator 51, i.e., a main magnet, a gradient magnetic field generator 52, i.e., gradient coils, an RF coil unit 53, i.e., an RF coil or RF coils, a table 55, and a display 56. The static magnetic field generator 51 generates a static magnetic field for aligning magnetic dipole moments of atomic nuclei of the object in a direction of the static magnetic field. The static magnetic field generator 51 may be formed as a permanent magnet or superconducting magnet using a cooling coil.

The gradient magnetic field generator 52 is connected to the controller 30 and generates a gradient magnetic field by applying a gradient to a static magnetic field in response to a control signal received from the controller 30. The gradient magnetic field generator 52 includes X, Y, and Z gradient coils for generating gradient magnetic fields in X-, Y-, and Z-axis directions crossing each other at right angles and generates a gradient signal according to a position of a region being imaged to differently induce resonance frequencies according to regions of the object.

The RF coil unit 53 connected to the controller 30 may emit an RF signal toward the object in response to a control signal received from the controller 30 and receive an MR signal emitted from the object. In detail, the RF coil unit 53 may transmit, toward atomic nuclei of the object having precessional motion, an RF signal having the same frequency as that of the precessional motion, stop transmitting the RF signal, and then receive an MR signal emitted from the object.

The RF coil unit 53 may be formed as a transmit RF coil for generating an electromagnetic wave having an RF corresponding to the type of an atomic nucleus, a receive RF coil for receiving an electromagnetic wave emitted from an atomic nucleus, or one transmitting/receiving RF coil serving both functions of the transmit RF coil and receive RF coil. In addition to the RF coil unit 53, a separate RF coil, i.e., a local RF coil, may be used. Examples of the separate coil may include a head coil, a spine coil, a torso coil, and a knee coil according to a region being imaged or to which the separate coil is attached.

The display 56 may be disposed outside and/or inside the scanner 50. The display 56 is controlled by the controller 30 to provide a user or the object with information related to medical imaging.

The display 56 may include the display 310 described with reference to FIG. 3.

The scanner 50 may include an object monitoring information acquisition unit configured to acquire and transmit monitoring information about a state of the object. For example, the object monitoring information acquisition unit may acquire monitoring information related to the object from a camera for capturing images of a movement or position of the object, a respiration measurer for measuring the respiration of the object, an electrocardiography (ECG) signal measurer for measuring the electrical activity of the heart, or a temperature measurer for measuring a temperature of the object and transmit the acquired monitoring information to the controller 30. The controller 30 may control an operation of the scanner 50 based on the monitoring information.

The controller 30 may control overall operations of the scanner 50.

The controller 30 may control a sequence of signals formed in the scanner 50. The controller 30 may control the gradient magnetic field generator 52 and the RF coil unit 53 according to a pulse sequence received from the operating unit 10 or a designed pulse sequence.

A pulse sequence may include all pieces of information required to control the gradient magnetic field generator 52 and the RF coil unit 53. For example, the pulse sequence may include information about a strength, a duration, and application timing of a pulse signal applied to the gradient magnetic field generator 52.

The controller 30 may control a waveform generator for generating a gradient wave, i.e., an electrical pulse according to a pulse sequence and a gradient amplifier for amplifying the generated electrical pulse and transmitting the same to the gradient magnetic field generator 52. Thus, the controller 30 may control formation of a gradient magnetic field by the gradient magnetic field generator 52.

The controller 30 may control an operation of the RF coil unit 53. For example, the controller 30 may supply an RF pulse having a resonance frequency to the RF coil unit 53 that emits an RF signal toward the object, and receive an MR signal received by the RF coil unit 53. The controller 30 may adjust emission of an RF signal and reception of an MR signal according to an operating mode by controlling an operation of a switch (e.g., a T/R switch) for adjusting transmitting and receiving directions of the RF signal and the MR signal based on a control signal.

The controller 30 may control a movement of the table 55 where the object is placed. Before MRI is performed, the controller 30 may move the table 55 into a bore of the scanner according to which region of the object is to be imaged.

The controller 30 may control the display 56. For example, the controller 30 control the on/off state of the display 56 or a screen to be output on the display 56 according to a control signal.

The controller 30 may be formed as an algorithm for controlling operations of the components in the MRI system 1, a memory, e.g., the memory 330, for storing data in the form of a program, and a processor for performing the above-described operations by using the data stored in the memory. The memory and the processor may be implemented as separate chips. Alternatively, the memory and processor may be incorporated into a single chip.

The controller 30 may include the processor 320 described with reference to FIG. 3.

The operating unit 10 may control overall operations of the MRI system 1 and include an image processor 11, an input device 12, and an output device 13.

The image processor 11 may control the memory to store an MR signal received from the controller 30, and generate image data with respect to the object from the stored MR signal by applying an image reconstruction technique.

For example, if a k-space of the memory is filled with digital data to complete k-space data, the image processor 11 may reconstruct image data from the k-space data by applying various image reconstruction techniques (e.g., by performing inverse Fourier transform on the k-space data) by using the image processor.

The image processor 11 may perform various signal processing operations on MR signals in parallel. For example, image processor 11 may perform signal processing on a plurality of MR signals received via a multi-channel RF coil in parallel to convert the plurality MR signals into image data. The image processor 11 may store the image data into the memory, or the controller 30 may store the same in an external server via a communication unit 60.

The input device 12 may receive, from the user, a control command for controlling the overall operations of the MRI system 1. For example, the input device 12 may receive, from the user, object information, parameter information, a scan condition, and information about a pulse sequence. The input device 12 may be a keyboard, a mouse, a track ball, a voice recognizer, a gesture recognizer, a touch screen, or any other input device.

The output device 13 may output image data generated by the image processor 11. The output device 13 may output a user interface (UI) configured so that the user may input a control command related to the MRI system 1. The output device 13 may be formed as a speaker, a printer, a display, or any other output device.

Although FIG. 8 shows that the operating unit 10 and the controller 30 are separate components, the operating unit 10 and the controller 30 may be included in a single device as described above. The processes respectively performed by the operating unit 10 and the controller 30 may be performed by another component. For example, the image processor 11 may convert an MR signal received from the controller 30 into a digital signal, or the controller 30 may directly perform the conversion of the MR signal into the digital signal.

The MRI system 1 may be connected to an external device such as a server, a medical apparatus, and a portable device (e.g., a smartphone, a tablet PC, a wearable device, etc.) via the communication unit 60.

The communication unit 60 may include at least one component that enables communication with an external device. For example, the communication unit 60 may include at least one of a local area communication module, a wired communication module 61, and a wireless communication module 62.

The communication unit 60 may receive a control signal and data from an external device and transmit the received control signal to the controller 30 so that the controller 30 may control the MRI system 1 according to the received signal.

Alternatively, by transmitting a control signal to an external device via the communication unit 60, the controller 30 may control the external device according to the control signal.

For example, the external device may process data of the external device according to a control signal received from the controller 30 via the communication unit 60.

A program for controlling the MRI system 1 may be installed on the external device and may include instructions for performing some or all of the operations of the controller 30.

The program may be preinstalled on the external device, or a user of the external device may download the program from a server providing an application for installation. The server providing an application may include a recording medium having the program recorded thereon.

A program stored in a server may be downloaded or be downloadable to another device. A computer-readable program may be downloaded from a remote data processing system so that the computer-readable program can be used on a computer-readable storage medium together with the remote data processing system.

According to embodiments, it is possible to obtain multiple contrast images including T1, T2, and PD images within a short time by applying an HbSSFP pulse sequence even without using fat suppression techniques.

According to embodiments, it is possible to obtain multiple contrast images in a single sequence by using an HbSSFP pulse sequence, thereby shortening the time required to obtain the images compared to when separately acquiring images of respective contrasts by using a technique according to the related art.

Embodiments may be implemented through non-transitory computer-readable recording media having recorded thereon computer-executable instructions and data. The instructions may be stored in the form of program codes, and when executed by a processor, generate a predetermined program module to perform a specific operation. When executed by the processor, the instructions may perform specific operations according to the embodiments.

While one or more embodiments have been described with reference to the figures, it will be understood by those of ordinary skill in the art that various changes in form and details may be made therein without departing from the spirit and scope of the present disclosure as defined by the following claims. Accordingly, the above embodiments and all aspects thereof are examples only and are not limiting.

What is claimed is:

1. A magnetic resonance imaging (MRI) apparatus comprising:
 a memory configured to store instructions; and
 a processor coupled to the memory and configured to execute the instructions to:
 apply a gradient echo pulse sequence that makes a sum of gradients applied during one repetition time (TR) in a slice selection direction, a phase encoding direction, and a frequency encoding direction equal zero and maintains spins in an object in a steady state, alternately and repeatedly apply, while the gradient echo pulse sequence is continuously applied, a first radio frequency (RF) pulse having a first flip angle in a first TR interval and a second RF pulse having a second flip angle having a magnitude different from a magnitude of the first flip angle in a second TR interval that follows the first TR interval, wherein the second TR interval and the first TR interval alternate with one another while the gradient echo pulse sequence is applied, and generate a magnetic resonance (MR) image based on an echo signal acquired when the spins are in the steady state.

2. The MRI apparatus of claim 1, wherein the processor is further configured to execute the instructions to:

acquire a first MR signal in a first steady state reached after applying, the first RF pulse, and acquire a first MR image based on the first MR signal;

acquire a second MR signal in a second steady state reached after applying the second RF pulse, and acquire a second MR image based on the second MR signal; and obtain at least one from among a sum image, which is a complex sum of the first MR image and the second MR image, and a difference image, which is a complex difference between the first MR image and the second MR image, wherein the MIR image is one from among the first MR image and the second MR image.

3. The MRI apparatus of claim 2, wherein the processor is further configured to execute the instructions to apply a weight to at least one from among the sum image and the difference image, and obtain a plurality of images having different contrasts, based on a weighted sum of the sum image and the difference image.

4. The MRI apparatus of claim 3, wherein the processor is further configured to execute the instructions to obtain the plurality of images to further include at least one from among a longitudinal relaxation time (T1) image, a transverse relaxation time (T2) image, and a proton density (PD) image, based on the weighted sum of the sum image and the difference image.

5. The MRI apparatus of claim 3, wherein the processor is further configured to execute the instructions to obtain the plurality of images to further include at least one image, in which a fat signal is suppressed, among a longitudinal relaxation time (T1) image, a transverse relaxation time (T2) image, and a proton density (PD) image, based on the weighted sum of the sum image and the difference image.

6. The MRI apparatus of claim 3, wherein the sum image has a contrast similar to that of a proton density (PD) image.

7. The MRI apparatus of claim 3, wherein the object includes cartilage, and the difference image includes information about the cartilage.

8. The MRI apparatus of claim 1, wherein the gradient echo pulse sequence uses a steady-state free precession (SSFP) imaging technique.

9. The MRI apparatus of claim 1, further comprising a display, wherein the processor is further configured to execute the instructions to:

obtain a plurality of images having different contrasts, based on the MR image; and control the display to display the plurality of images.

10. The MRI apparatus of claim 1, further comprising a scanner in which a static magnetic field and a gradient magnetic field are generated and which is configured to receive an MR signal emitted from the object.

11. A method of generating a magnetic resonance (MR) image, the method comprising:

applying a gradient echo pulse sequence that makes a sum of gradients applied during one repetition time (TR) in a slice selection direction, a phase encoding direction, and a frequency encoding direction equal zero and maintains spins in an object in a steady state;

alternately and repeatedly applying, while the gradient echo pulse sequence is continuously applied, a first radio frequency (RF) pulse having a first flip angle in a first TR interval and a second RF pulse having a second flip angle having a magnitude different from a magnitude of the first flip angle in a second TR interval that follows the first TR interval, wherein the second TR interval and the first TR interval alternate with one another while the gradient echo pulse sequence is applied; and generating an MR image based on an echo signal acquired when the spins are in the steady state.

12. The method of claim 11, wherein the generating the MR image further comprises:

acquiring a first MR signal in a first steady state reached after applying the first RF pulse, and acquiring a first MR image based on the first MR signal;

acquiring a second MR signal in a second steady state reached after applying the second RF pulse, and acquiring a second MR image based on the second MR signal; and obtaining at least one from among a sum image, which is a complex sum of the first MR image and the second MR image, and a difference image, which is a complex difference between the first MR image and the second MR image, wherein the MR image is one from among the first MR image and the second MR image.

13. The method of claim 12, further comprising:

applying a weight to at least one from among the sum image and the difference image; and obtaining a plurality of images having different contrasts, based on a weighted sum of the sum image and the difference image.

14. The method of claim 13, wherein the obtaining the plurality of images having the different contrasts further comprises:

obtaining at least one from among a longitudinal relaxation time (T1) image, a transverse relaxation time (T2) image, and a proton density (PD) image, based on the weighted sum of the sum image and the difference image.

15. The method of claim 13, wherein the obtaining the plurality of images having the different contrasts further comprises:

obtaining at least one image, in which a fat signal is suppressed, among a longitudinal relaxation time (T1) image, a transverse relaxation time (T2) image, and a proton density (PD) image, based on the weighted sum of the sum image and the difference image.

16. The method of claim 13, wherein the sum image has a contrast similar to that of a proton density (PD) image.

17. The method of claim 13, wherein the object includes cartilage, and the difference image includes information about the cartilage.

18. The method of claim 11, wherein the gradient echo pulse sequence uses a steady-state free precession (SSFP) imaging technique.

19. The method of claim 11, further comprising:
   obtaining a plurality of images having different contrasts, based on the MR image; and
   displaying the plurality of images having the different contrasts.

20. A computer program product comprising a computer-readable storage medium having stored therein a program which, when executed by a computer, causes the computer to execute the method of claim 11.

* * * * *